(12) United States Patent
Ohshima

(10) Patent No.: US 8,295,021 B2
(45) Date of Patent: Oct. 23, 2012

(54) OVERCURRENT PROTECTION APPARATUS FOR LOAD CIRCUIT

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 145 days.

(21) Appl. No.: 12/995,721

(22) PCT Filed: Jun. 2, 2009

(86) PCT No.: PCT/JP2009/060094
§ 371 (c)(1),
(2), (4) Date: Dec. 2, 2010

(87) PCT Pub. No.: WO2009/148063
PCT Pub. Date: Dec. 10, 2009

(65) Prior Publication Data
US 2011/0075309 A1 Mar. 31, 2011

(30) Foreign Application Priority Data
Jun. 4, 2008 (JP) .................. 2008-147255

(51) Int. Cl.
*H02H 3/087* (2006.01)
*H02H 9/02* (2006.01)
(52) U.S. Cl. .................. 361/87; 361/93.1; 361/93.7
(58) Field of Classification Search .............. None
See application file for complete search history.

(56) References Cited

U.S. PATENT DOCUMENTS

| 2004/0100234 A1* | 5/2004 | Okubo et al. ............. 323/276 |
|---|---|---|
| 2004/0207967 A1 | 10/2004 | Ohshima |
| 2005/0094340 A1* | 5/2005 | Dai et al. ................. 361/93.1 |
| 2005/0275394 A1* | 12/2005 | Moraveji et al. ............ 323/312 |
| 2006/0133000 A1* | 6/2006 | Kimura ...................... 361/93.1 |
| 2009/0001948 A1* | 1/2009 | Martinez et al. ............. 323/271 |
| 2011/0075309 A1* | 3/2011 | Ohshima ..................... 361/87 |

FOREIGN PATENT DOCUMENTS

| JP | 2002-353794 A | 12/2002 |
|---|---|---|
| JP | 2007-135274 A | 5/2007 |
| JP | 2008-263760 A | 10/2008 |
| JP | 2009-100281 A | 5/2009 |

OTHER PUBLICATIONS

International Search Report (PCT/ISA/210) issued Jun. 30, 2009, in International Application No. PCT/JP2009/060094.

* cited by examiner

*Primary Examiner* — Stephen W Jackson
*Assistant Examiner* — Angela Brooks
(74) *Attorney, Agent, or Firm* — Sughrue Mion, PLLC

(57) ABSTRACT

To provide an overcurrent protection apparatus for a load circuit which can detect an overcurrent accurately without being influenced by the offset voltage Voff of an amplifier (AMP1). When the amplifier (AMP1) has the offset voltage Voff which is a positive value (Voff>0), a current obtained by subtracting a current Ia from a current I1 flowing through a resistor R1 by conducting a current source IA is flown into a resistor R3. In contrast, when the amplifier (AMP1) has the offset voltage Voff which is a negative value (Voff<0), a voltage drop is generated at a resistor R2 by conducting a current source IB to thereby control so that a voltage Vds becomes same as the voltage generated at the resistor R1. Thus, since a voltage V3 generated at the resistor R3 becomes a voltage from which the influence of the offset voltage Voff is eliminated, it is possible to determine an overcurrent accurately by eliminating the influence of the offset voltage Voff.

4 Claims, 2 Drawing Sheets

OVERCURRENT PROTECTION APPARATUS FOR LOAD CIRCUIT

TECHNICAL FIELD

The present invention relates to an overcurrent protection apparatus which detects an overcurrent, when the overcurrent flows through a load circuit, and protects the load circuit and, in particular, relates to a technique of avoiding an influence due to the offset voltage of an operational amplifier.

BACKGROUND ART

For example, loads such as various kinds of lamps, motors etc. mounted on a vehicle are coupled to a battery (power source) via semiconductor elements, whereby the operations of the loads are controlled by switching the on/off states of the corresponding semiconductor elements, respectively. An overcurrent may flow into a load circuit configured by such the battery, semiconductor elements and loads due to a trouble or an operational failure etc. of the load circuit or various kinds of circuits coupled to the load circuit. When the overcurrent flows, there arises a problem that the semiconductor elements are overheated and harness wires coupling between the loads and the power source are also overheated. Thus, various kinds of overcurrent protection apparatuses have been proposed each of which is arranged to immediately detect an overcurrent when the overcurrent is generated to thereby interrupt a current flowing into a load circuit.

FIG. 2 is a circuit diagram showing the configuration of a load circuit provided with an overcurrent protection apparatus of the related art (see a patent document 1). As shown in FIG. 2, the load circuit includes a series circuit formed by a battery VB, a MOSFET (T101) as a semiconductor element, a load RL such as a lamp or a motor. The gate of the MOSFET (T101) is coupled to a driver circuit 101 via a resistor R110. Thus, the MOSFET (T101) is turned on and off in response to a drive signal output from the driver circuit 101 to thereby switch the load RL between a driving state and a stop state.

The drain of the MOSFET (T101) is coupled to a ground via a series circuit of resistors R104 and R105 and also coupled to the ground via a series circuit of a resistor R101, a transistor T102 and a resistor R103. A coupling point between the transistor T102 and the resistor R101 is coupled to the inverting input terminal of an amplifier AMP101 and the non-inverting input terminal of an amplifier AMP101 is coupled to the source of the MOSFET (T101). Further, the output terminal of the amplifier AMP101 is coupled to the gate of the transistor T102.

A coupling point (voltage V3) between the transistor (T102) and the resistor R103 is coupled to the inverting input terminal of a comparator CMP101 and a coupling point (voltage V4) between the resistors R104 and R105 is coupled to the non-inverting input terminal of the comparator CMP 101.

When the MOSFET (T101) is turned on and a current ID flows into the load circuit, a current I1 flows into the series circuit of the resistor R101, transistor T102 and resistor R103. In this case, the amplifier AMP101 controls the current I1 flowing into the transistor T102 so that the drain-source voltage Vds of the MOSFET (T101) becomes same as a voltage generated across the both ends of the resistor R101.

Thus, the voltage V3 generated at the resistor R103 becomes a value obtained by multiplying the voltage Vds by m (m=R103/R101). The amplified voltage V3 is input to the inverting input terminal of the comparator CMP101. The voltage V4 obtained by dividing a voltage V1 by the resistors R104 and R105 is input to the non-inverting input terminal of the comparator CMP101 as an overcurrent determination voltage. When the load current ID becomes an overcurrent state, the voltage Vds becomes large and so the voltage V3 becomes larger than the voltage V4. Thus, since the output state of the comparator CMP101 is inverted, the overcurrent state is detected.

Supposing that the drain voltage of the MOSFET (T101) is V1, the source voltage thereof is V2 and the on-resistance thereof is Ron, the voltage Vds is represented by the following expression (1).

$$Vds = V1 - V2 = Ron * ID \quad (1)$$

The voltage Vds is amplified by an amplifier circuit configured by the resistors R101, R103, the transistor T102 and the amplifier AMP101. There is an offset voltage in the amplifier AMP101. The detection error of the overcurrent arises due to this offset voltage. Hereinafter, this detection error will be examined in the case where the amplifier AMP101 has the offset voltage ±Voff. In FIG. 2, the amplifier AMP101 is shown within a frame of an alternate long and short dash line and the offset voltage ±Voff is shown separately from the symbol of the operational amplifier. Thus, the operational amplifier represented by a triangle is an ideal operational amplifier having an offset voltage of zero volt.

Thus, the magnitude of the current I1 flowing through a path from the power source VB to the ground GND via the resistor R101, transistor T102 and resistor R103 becomes a current value which is determined as a result that the voltage Va and the voltage V2 are always controlled to be the same to each other by the amplifier AMP 101 and the transistor T102.

Supposing that the offset voltage of the amplifier AMP101 is ±Voff, the following expression is obtained.

$$Vds \pm Voff = R101 * I1 \quad (2)$$

Supposing that the voltage drop V3 of the resistor R103 becomes a value obtained by amplifying the voltage Vds and m is R103/R101, the voltage V3 is represented by the following expression (3).

$$\begin{aligned} V3 &= R103 * I1 \\ &= R103 / R101 * R101 * I1 \\ &= R103 / R101 * (Vds \pm Voff) \\ &= m * (Ron * ID \pm Voff) \end{aligned} \quad (3)$$

As understood from the expression (3), a voltage obtained by multiplying the offset voltage (±Voff) by m is contained in the voltage V3, which results in the cause of variance.

The amplified voltage V3 is input to the inverting input terminal of the comparator CMP101 and the voltage V4 obtained by dividing the voltage V1 by the resistors R104 and R105 is input to the non-inverting input terminal of the comparator CMP101 as the over current determination voltage. When the current ID flowing into the load RL becomes the overcurrent state, the voltage Vds becomes large and so the voltage V3 becomes larger than the voltage V4. Thus, since the output signal of the comparator CMP101 is inverted, the overcurrent state is detected. Supposing that a value of the current ID detected as the overcurrent is Iovc, the following expression (4) is obtained.

$$V3 = m * (Ron * Iovc \pm Voff) = V4$$

$$Iovc = V4/m/Ron \pm Voff/Ron \quad (4)$$

When the amplifier AMP101 does not have the offset voltage, the current I ovc becomes a constant value determined by V4, R101, R103 and Ron. In contrast, when the amplifier AMP101 has the offset voltage (±Voff), the overcurrent detection value I ovc varies and the variance thereof becomes ±Voff/Ron. The variance caused by the offset voltage Voff becomes a constant value obtained by dividing the offset voltage Voff by the on resistance Ron.

In the case where the amplifier AMP101 is formed as an IC, the variance range of the offset voltage (±Voff) of the amplifier AMP101 depends on the process of forming the IC. Supposing that Ron is 3 [mΩ], since the normal IC has the variance range of about ±10 [mv], an interruption current value varies in a range of ±3.3 [A].

PRIOR ART DOCUMENT

Patent Document

Patent Document 1: JP-A-2002-353794

SUMMARY OF THE INVENTION

Problems that the Invention is to Solve

As described above, the overcurrent protection apparatus for a load circuit of the related art has the problem that, when the amplifier AMP101 has the offset voltage Voff, since the overcurrent determination value I ovc is influenced by the offset voltage Voff, the circuit can not be interrupted based on the accurate overcurrent determination value I ovc.

The invention intends to solve such the problem of the related art and an object of the invention is to provide an overcurrent protection apparatus for a load circuit which can avoid the influence of the offset voltage Voff of an operational amplifier on the detection of an overcurrent and so can interrupt the load circuit based on an accurate overcurrent determination value I ovc.

Means for Solving the Problems (1) In order to attain the object, the overcurrent protection apparatus for a load circuit according to the invention is the overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode of the power source and a second main electrode of the first semiconductor element (T1) being coupled to a negative electrode of the power source via the load, the overcurrent protection apparatus comprising:

an amplifying section (AMP1);

a first resistor (R1) that includes one end which is coupled to the first main electrode of the first semiconductor element (T1) and the other end which is coupled to an inverting input terminal of the amplifying section (AMP1);

a second resistor (R2) that includes one end which is coupled to a point c that is the second main electrode of the first semiconductor element (T1) and the other end which is coupled to a non-inverting input terminal of the amplifying section (AMP1);

a third resistor (R3);

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting input terminal of the amplifying section (AMP1), and the control electrode being coupled to an output terminal of the amplifying section; and a first current source (IA) which is disposed between the point a and a ground, wherein in a case where a current flows through the load and a voltage at the point a becomes lower than a voltage (V2) at the point c due to an offset voltage of the amplifying section (AMP1), the first current source (IA) is set to flow a current that is equal to a current obtained by dividing a voltage between the point c and the point a by a resistance value of the first resister (R1).

(2) In order to attain the object, the overcurrent protection apparatus for a load circuit according to the invention is the overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode of the power source and a second main electrode of the first semiconductor element (T1) being coupled to a negative electrode of the power source via the load, the overcurrent protection apparatus comprising:

an amplifying section (AMP1);

a first resistor (R1) that includes one end which is coupled to the first main electrode of the first semiconductor element (T1) and the other end which is coupled to an inverting input terminal of the amplifying section (AMP1);

a second resistor (R2) that includes one end which is coupled to a point c that is the second main electrode of the first semiconductor element (T1) and the other end which is coupled to a non-inverting input terminal of the amplifying section (AMP1);

a third resistor (R3);

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting input terminal of the amplifying section (AMP1), and the control electrode being coupled to an output terminal of the amplifying section; and a second current source (IB) which is disposed between a ground and a point b which is a coupling point between the second resistor (R2) and the non-inverting input terminal of the amplifying section (AMP1), wherein in a case where a current flows through the load and a voltage at the point a becomes higher than a voltage (V2) at the point c due to an offset voltage of the amplifying section (AMP1), the second current source (IB) is set to flow a current through the second resistor (R2) so that the voltage between the point c and the point a becomes zero.

(3) The overcurrent protection apparatus for a load circuit according to the configuration (1), further including:

a comparing section (CMP1) that includes one input terminal and the other input terminal, a voltage (V3) at a coupling point (point e) between the second semiconductor element (T2) and the third resistor (R3) being input to the one input terminal, and a determination voltage (V4) generated by dividing a voltage (V1) of the first main electrode of the first semiconductor element (T1) by a resistance ratio (R4:R5) being input to the other input terminal, wherein in a case where a voltage (V4/m) obtained by dividing the determination voltage (V4) by a value (m) which is obtained by dividing a value of the third resistor (R3) by a value of the first resistor (R1) is generated between the first main electrode and the second main electrode of the first semiconductor element (T1), a current value of a current flowing through the first current source (IA) becomes a current value of a current for changing an output signal of the comparing section (CMP1) from a low level to a high level.

(4) The overcurrent protection apparatus for a load circuit according to the configuration (2), further including:

a comparing section (CMP1) that includes one input terminal and the other input terminal, a voltage (V3) at a coupling point (point e) between the second semiconductor element (T2) and the third resistor (R3) being input to the one input terminal, and a determination voltage (V4) generated by dividing a voltage (V1) of the first main electrode of the first semiconductor element (T1) by a resistance ratio (R4:R5) being input to the other input terminal, wherein in a case where a voltage (V4/m) obtained by dividing the determination voltage (V4) by a value (m) which is obtained by dividing a value of the third resistor (R3) by a value of the first resistor (R1) is generated between the first main electrode and the second main electrode of the first semiconductor element (T1), a current flowing through the second current source (1B) has a current value for changing an output signal of the comparing section (CMP1) from a high level to a low level.

EFFECTS OF THE INVENTION

According to the invention having the configuration (1) or (2), when the amplifier (AMP1) has an offset voltage Voff which is a positive value (Voff>0), a current obtained by subtracting a current Ia from a current I1 flowing through the first resistor (R1) by conducting the first current source (IA) is flown into the third resistor (R3). In contrast, when the amplifier (AMP1) has the offset voltage Voff which is a negative value (Voff<0), a voltage drop is generated at the second resistor (R2) by conducting the second current source (IB) to thereby control so that a voltage Vds becomes the same as the voltage generated at the first resistor (R1). Thus, since a voltage V3 generated at the third resistor (R3) becomes a voltage from which the influence of the offset voltage Voff is eliminated, it is possible to determine an overcurrent accurately by eliminating the influence of the offset voltage Voff. As a result, since it is not necessary to enlarge the diameter of an electric wire in view of the overcurrent, the diameter of the electric wire used for the load circuit can be made small.

According to the invention having the configuration (3) or (4), in a case where a voltage shown by (V4/m) is applied between the first main electrode and the second main electrode of the first semiconductor element (T1), the first current source (IA) is disposed when the output signal of the comparing section (CMP1) is a low level, whilst the second current source (IB) is disposed when the output signal of the comparing section (CMP1) is a high level, whereby the influence of the offset voltage Voff is removed. Thus, since it is not necessary to provide the two current sources, the configuration of the apparatus can be simplified.

MODE FOR CARRYING OUT THE INVENTION

Figure 1:
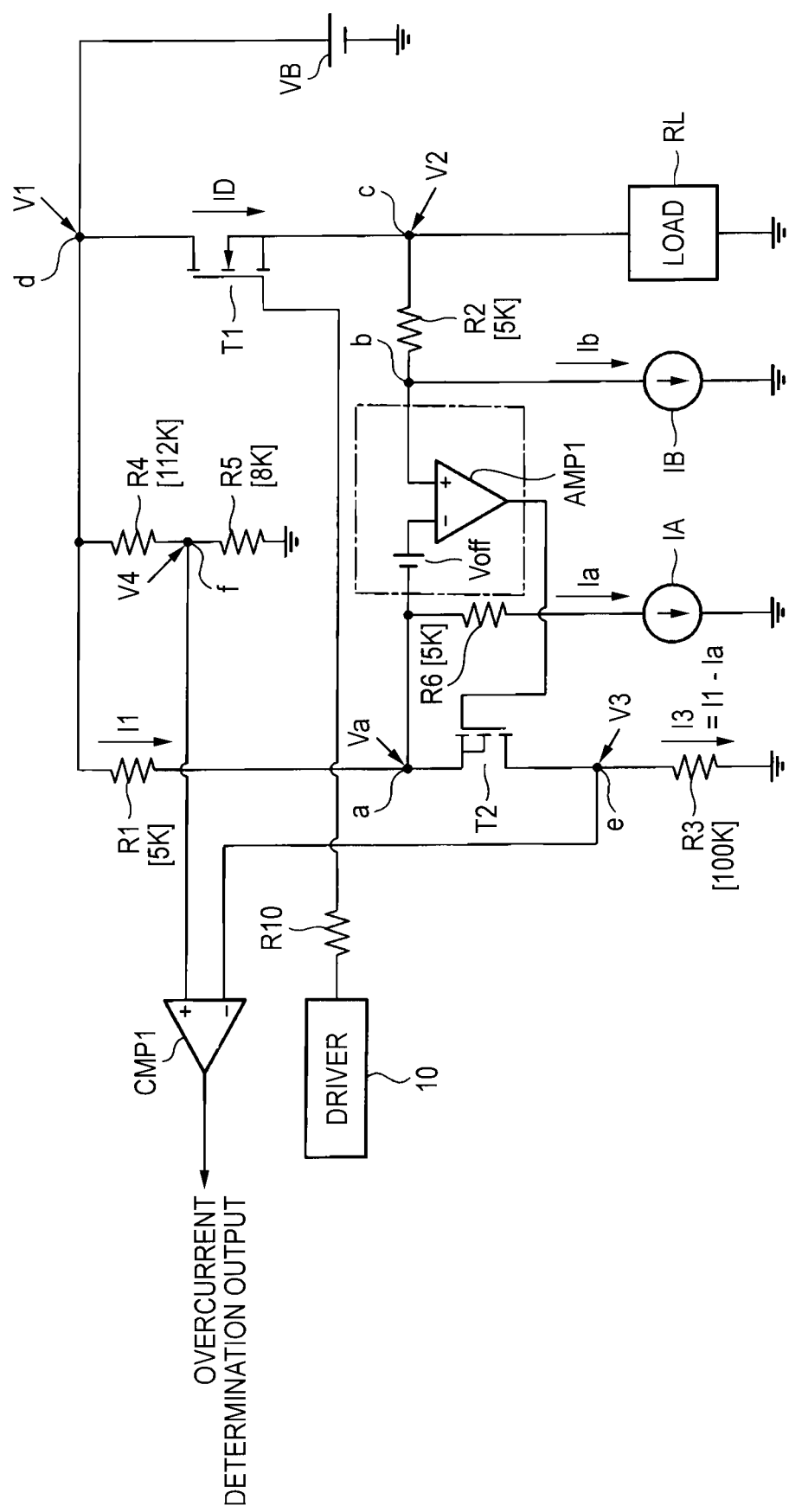
FIG. 1 is a circuit diagram showing the configuration of an overcurrent protection apparatus according to an embodiment of the invention.
Figure 2:
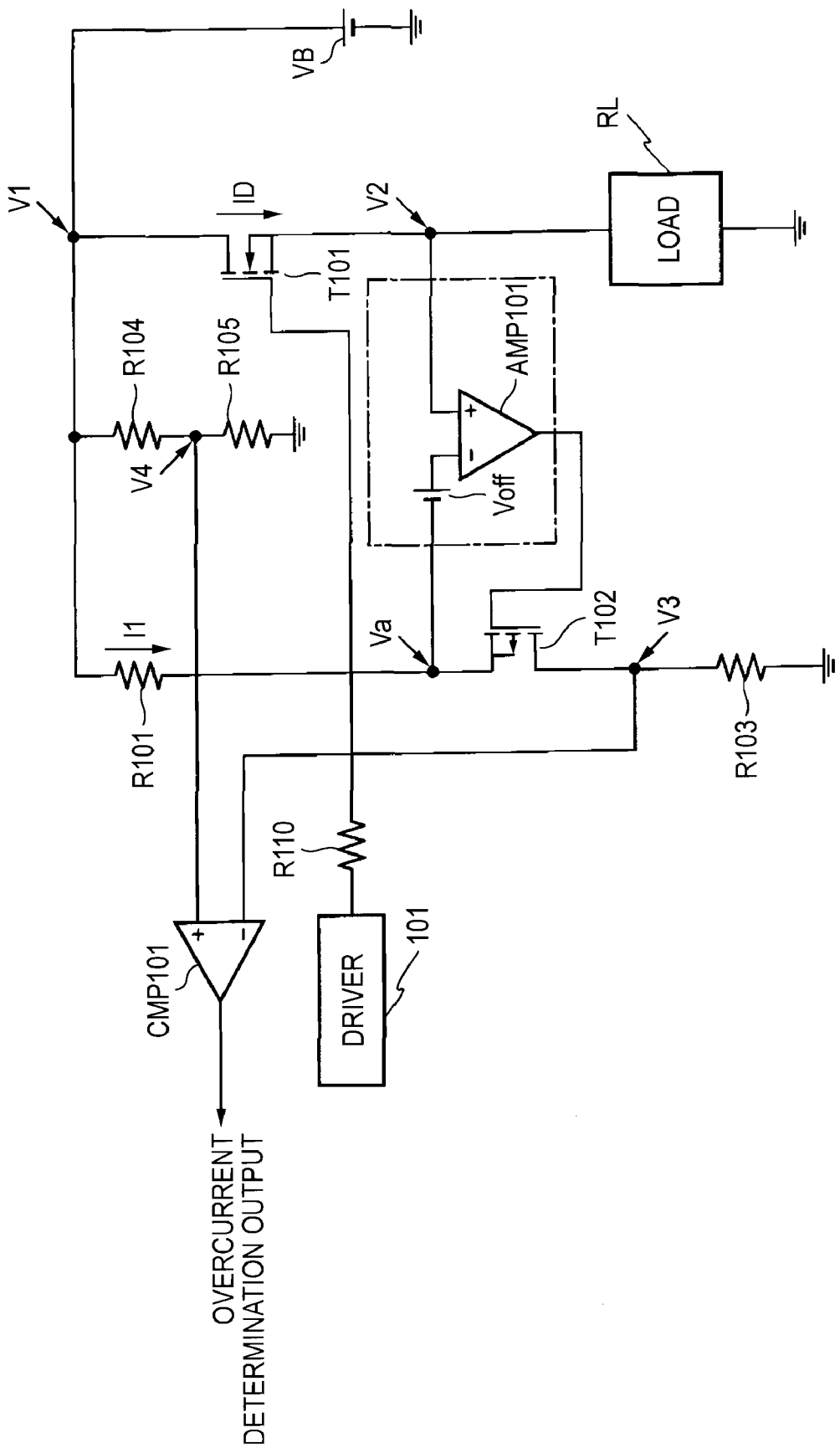
FIG. 2 is a circuit showing the configuration of an overcurrent protection apparatus of a related art.

Hereinafter, an embodiment according to the invention will be explained with reference to a drawing. FIG. 1 is a circuit diagram showing the configuration of a load circuit provided with an overcurrent protection apparatus according to the embodiment of the invention. As shown in FIG. 1, the load circuit includes a series circuit formed by a battery (power source) VB, a MOSFET (T1) as a semiconductor element and a load RL such as a lamp or a motor. The gate of the MOSFET (T1) is coupled to a driver circuit 10 via a resistor R10. Thus, the MOSFET (T1) is turned on and off in response to a drive signal output from the driver circuit 10 to thereby switch the load RL between a driving state and a stop state.

The drain (point d: voltage V1) of the MOSFET (T1) is coupled to a ground via a series circuit of a resistor R4 (for example, 112 [KΩ]) and R5 (for example, 8 [KΩ]) and also coupled to the ground via a series circuit of a resistor R1 (for example, 5 [KΩ]), a transistor T2 and a resistor R3 (for example, 100 [KΩ]). A coupling point (point a: voltage Va) between the transistor T2 and the resistor R1 is coupled to the inverting input terminal of an amplifier AMP1. The non-inverting input terminal of the amplifier AMP1 is coupled to the source (point c: voltage V2) of the MOSFET T1 via a resistor R2 (for example, 5 [KΩ]). Further, the output terminal of the amplifier AMP1 is coupled to the gate of the transistor T2. The amplifier AMP1 has an offset voltage Voff and the offset voltage ±Voff is shown separately from the symbol of the amplifier. That is, a triangle symbol of the amplifier shown in AMP1 represents an ideal operational amplifier.

A coupling point (point e: voltage V3) between the transistor T2 and the resistor R3 is coupled to the inverting input terminal of a comparator CMP1 and a coupling point (point f: voltage V4) between the resistors R4 and R5 is coupled to the non-inverting input terminal of the comparator CMP1.

The point a which is the coupling point between the resistor R1 and the transistor T2 is grounded via a resistor R6 (for example, 5 [KΩ]) and a current source IA. Further, the point b which is the non-inverting input terminal of the amplifier AMP1 is grounded via a current source IB and a resistor R2 (for example, 5 [KΩ]) is disposed between the point b and the point c which is the source of the MOSFET T1.

Next, the operation of the overcurrent protection apparatus according to the embodiment will be explained. Supposing that the currents flowing through the current sources IA, IB are Ia, Ib, respectively, when there is no offset voltage Voff in the amplifier AMP1, that is, Voff=0 [V], the voltage Va becomes V2 even if Ia=Ib=0 [A].

In this case, supposing that m=R3/R1, the voltage V3 at the point e which is the coupling point between the transistor T2 and the resistor R3 is represented by the following expression (5).

$$V3 = Vds * R3/R1 = Vds * m \quad (5)$$

That is, the voltage V3 is a voltage obtained by amplifying the drain-source voltage Vds of the MOSFET (T1) accurately by an amplification factor m.

In the case where the amplifier AMP1 has the offset voltage Voff which is a positive value, that is, Voff>0, if Ia=Ib=0 [A], V2a is equal to Voff and larger than 0 supposing that the voltage between the source voltage V2 of the MOSFET (T1) and the voltage Va at the point a is V2a (=V2−Va). That is, since the amplifier AMP1 controls the current I1 in a manner that (Va+Voff) becomes equal to V2, V2a becomes equal to Voff Further, the current I1 flowing through the resistor R1 is expressed by the following expression (6).

$$I1 = (Vds + V2a)/R1 \qquad (6)$$

Since the current I1 flows through the resistor R3, the voltage V3 is expressed by the following expression (7).

$$\begin{aligned} V3 &= R3 * (Vds + V2a)/R1 \\ &= m * (Vds + V2a) \\ &= m * Vds + m * V2a \\ &= m * Vds + m * Voff \end{aligned} \qquad (7)$$

From the expression (7), the voltage V3 generated at the resistor R3 contains a voltage obtained by multiplying the offset voltage Voff by m, which voltage causes an error.

According to the embodiment, in order to remove such an error, the current Ia=V2a/R1 flows through the current source 1A. Supposing that a coupling point between a power source line and the drain of the MOSFET (T1) is d, the current Ia flows from the point d to the ground GND via R1, R6 and IA. As a result, the current I3 flowing through the resistor R3 does not coincide with the current I1 but becomes smaller that I1. That is, the current I3 is expressed by the following expression (8).

$$I3 = I1 - Ia = I1 - V2a/R1 \qquad (8)$$

Thus, the following expression (9) is obtained.

$$\begin{aligned} V3 &= R3 * I3 \\ &= R3 * (I1 - V2a/R1) \\ &= R3 * ((Vds + V2a)/R1 - V2a/R1) \\ &= R3 * Vds/R1 \\ &= m * Vds \end{aligned} \qquad (9)$$

From the expression (9), when the current Ia (=V2a/R1) is flown through the current source IA, the voltage V3 becomes a voltage accurately m times as large as the voltage Vds, and so the influence of the offset voltage Voff can be removed.

A method of finding the current Ia (=V2a/R1) will be explained. When the resistor R6 is set to have a resistance value same as that of the resistor R1 (that is, R1=R6), a voltage drop VR6 generated by flowing the current Ia through the resistor R6 is expressed by the following expression (10).

$$VR6 = Ia * R6 = V2a/R1 * R6 = V2a \qquad (10)$$

That is, in order to find the current Ia=V2a/R1, the current Ia is increased gradually from 0 to find a current value by which the voltage drop generated at the resistor R6 becomes same as the voltage V2a or the offset voltage Voff. At this time, the output signal of the comparator CMP1 changes from a low level to a high level.

In this manner, when the offset voltage Voff of the amplifier AMP1 is a positive value, the current Ia is determined by the above method. Then, when the current Ia thus determined is flown through the current source IA, the influence of the offset voltage Voff can be removed.

Next, the explanation will be made as to a case where the amplifier AMP1 has the offset voltage Voff which is a negative value, that is, Voff<0. In this case, if Ia=Ib=0 [A], V2a between the source voltage V2 of the MOSFET (T1) and the voltage Va at the point a is equal to Voff (<0).

In this case, the current of the current source IA is kept to 0, whilst the current Ib of the current source IB is increased from 0. The current Ib flows from the source (point c) of the MOSFET (T1) to the ground GND via R2, point b and current source IB to thereby generate a voltage drop VR2 at the resistor R2. Thus, the voltage Va2 can be made 0 by adjusting the magnitude of the current Ib. At this time, VR2 becomes equal to Voff and further the output signal of the comparator CMP1 changes from the high level to the low level. In this case, the current Ib also flows through the MOSFET (T1) to generate a voltage drop at the on-resistor Ron thereof. However, since the value of the on-resistor Ron of the MOSFET (T1) is quite small as compared with a value of the resistor R2, the voltage drop generated at the on-resistor Ron by the current Ib is negligible. When the current Ib thus obtained is set as the current value of the current source IB, the influence of the offset voltage Voff is removed and the expression (9) is satisfied.

In this manner, even if the offset voltage Voff is a negative value, the influence of the offset voltage Voff can be removed.

As described above, according to the overcurrent protection apparatus for the load circuit according to the embodiment, even if the amplifier AMP1 has the offset voltage Voff, it is possible to detect an overcurrent by removing the influence of the offset voltage Voff. Thus, when an overcurrent flows through the load RL, the overcurrent can be surely detected to thereby protect the load circuit. As a result, since it is not necessary to enlarge the diameter of an electric wire in view of the overcurrent, the diameter of the electric wire used for the load circuit can be made small.

Explanation of Modified Example

In the embodiment, the influence of the offset voltage Voff of the amplifier AMP1 is removed in a manner that the current source IA is made conductive when the offset voltage Voff has a positive value (Voff>0) and the current source IB is made conductive when the offset voltage Voff has a negative value (Voff<0). That is, the embodiment is configured to employ one of the current sources IA and IB depending on whether the offset voltage Voff has positive value or a negative value.

In this respect, since the offset voltage Voff of the amplifier AMP1 is a permanently determined value not changing from a positive value to a negative value or vise versa, it is sufficient to provide only one of the current sources IA and IB.

Thus, according to the modified example of the invention, it is supposed that both the current source IA and the current source IB shown in FIG. 1 are deleted from the circuit and a voltage (V4/m) is applied between the drain and the source of the MOSFET (T1). In this case, when the output signal of the comparator CMP1 becomes the low level, it is determined that the offset voltage Voff is a positive value (Voff>0). Then, it is sufficient to provide only the current source IA.

On the other hand, when the output signal of the comparator CMP1 becomes the high level, since it is determined that the offset voltage Voff is a negative value (Voff<0), it is sufficient to provide only the current source IB. By using such the method, since it is not necessary to use the two current sources IA and IB as shown in FIG. 1, the circuit configuration can be simplified and the low cost and the small space can be realized.

Although the explanation has been made as to the embodiment of the overcurrent protection apparatus for the load circuit according to the invention shown in the drawing, the invention is not limited thereto and the configurations of the respective portions can be replaced by arbitrary portions having the similar functions, respectively.

For example, in the embodiment, although the MOSFET (T1) is used as an example of the semiconductor element, the invention is not limited thereto and another semiconductor element may be employed therefore.

Although the invention has been explained with reference to the particular embodiment, it will be apparent for those skilled in the art that various changes and modifications may be made without departing from the spirit and scope of the invention.

The present application is based on Japanese Patent Application (Japanese Patent Application No. 2008-147255) filed on Jun. 4, 2008, the content of which is incorporated by reference.

INDUSTRIAL APPLICABILITY

The invention is quite useful in order to suppress the variance of the output of the operational amplifier due to the offset voltage.

EXPLANATION OF SYMBOLS 10 driver circuit
VB battery (power source)
RL load
CMP1 comparator
AMP1 amplifier (amplifying section)
T1 MOSFET (first semiconductor element)

The invention claimed is:

1. An overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode of the power source and a second main electrode of the first semiconductor element (T1) being coupled to a negative electrode of the power source via the load, the overcurrent protection apparatus comprising:
   an amplifying section (AMP1);
   a first resistor (R1) that includes one end which is coupled to the first main electrode of the first semiconductor element (T1) and the other end which is coupled to an inverting input terminal of the amplifying section (AMP1);
   a second resistor (R2) that includes one end which is coupled to a point c that is the second main electrode of the first semiconductor element (T1) and the other end which is coupled to a non-inverting input terminal of the amplifying section (AMP1);
   a third resistor (R3);
   a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting input terminal of the amplifying section (AMP1), and the control electrode being coupled to an output terminal of the amplifying section; and
   a first current source (IA) which is disposed between the point a and a ground,
   wherein in a case where a current flows through the load and a voltage at the point a becomes lower than a voltage (V2) at the point c due to an offset voltage of the amplifying section (AMP1), the first current source (IA) is set to flow a current that is equal to a current obtained by dividing a voltage between the point c and the point a by a resistance value of the first resister (R1).

2. An overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode of the power source and a second main electrode of the first semiconductor element (T1) being coupled to a negative electrode of the power source via the load, the overcurrent protection apparatus comprising:
   an amplifying section (AMP1);
   a first resistor (R1) that includes one end which is coupled to the first main electrode of the first semiconductor element (T1) and the other end which is coupled to an inverting input terminal of the amplifying section (AMP1);
   a second resistor (R2) that includes one end which is coupled to a point c that is the second main electrode of the first semiconductor element (T1) and the other end which is coupled to a non-inverting input terminal of the amplifying section (AMP1);
   a third resistor (R3);
   a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting input terminal of the amplifying section (AMP1), and the control electrode being coupled to an output terminal of the amplifying section; and
   a second current source (IB) which is disposed between a ground and a point b which is a coupling point between the second resistor (R2) and the non-inverting input terminal of the amplifying section (AMP1),
   wherein in a case where a current flows through the load and a voltage at the point a becomes higher than a voltage (V2) at the point c due to an offset voltage of the amplifying section (AMP1), the second current source (IB) is set to flow a current through the second resistor (R2) so that the voltage between the point c and the point a becomes zero.

3. The overcurrent protection apparatus according to claim 1, further comprising:
   a comparing section (CMP1) that includes one input terminal and the other input terminal, a voltage (V3) at a coupling point (point e) between the second semiconductor element (T2) and the third resistor (R3) being input to the one input terminal, and a determination voltage (V4) generated by dividing a voltage (V1) of the first main electrode of the first semiconductor element (T1) by a resistance ratio (R4:R5) being input to the other input terminal,
   wherein in a case where a voltage (V4/m) obtained by dividing the determination voltage (V4) by a value (m) which is obtained by dividing a value of the third resistor (R3) by a value of the first resistor (R1) is generated between the first main electrode and the second main electrode of the first semiconductor element (T1), a current value of a current flowing through the first current source (IA) becomes a current value of a current for changing an output signal of the comparing section (CMP1) from a low level to a high level.

4. The overcurrent protection apparatus according to claim 2, further comprising:

a comparing section (CMP1) that includes one input terminal and the other input terminal, a voltage (V3) at a coupling point (point e) between the second semiconductor element (T2) and the third resistor (R3) being input to the one input terminal, and a determination voltage (V4) generated by dividing a voltage (V1) of the first main electrode of the first semiconductor element (T1) by a resistance ratio (R4:R5) being input to the other input terminal, wherein in a case where a voltage (V4/m) obtained by dividing the determination voltage (V4) by a value (m) which is obtained by dividing a value of the third resistor (R3) by a value of the first resistor (R1) is generated between the first main electrode and the second main electrode of the first semiconductor element (T1), a current flowing through the second current source (1B) has a current value for changing an output signal of the comparing section (CMP1) from a high level to a low level.

* * * * *